(12) United States Patent
Nakahara et al.

(10) Patent No.: US 6,337,307 B1
(45) Date of Patent: Jan. 8, 2002

(54) OXIDE SUPERCONDUCTING CONDUCTOR WITH INTERMEDIATE LAYER HAVING ALIGNED CRYSTAL ORIENTATION

(75) Inventors: Tuneo Nakahara; Masaya Konishi; Ken-ichi Sato, all of Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/363,816

(22) Filed: Jul. 30, 1999

(30) Foreign Application Priority Data

Jul. 30, 1998 (JP) ............................................ 10-215441

(51) Int. Cl.⁷ ................................................. H01B 12/00
(52) U.S. Cl. .................... 505/323; 174/125.1; 505/235; 505/238; 29/599
(58) Field of Search ................... 174/125.1; 505/232, 505/235, 237, 238, 704, 887; 29/599

(56) References Cited

U.S. PATENT DOCUMENTS

| | | | |
|---|---|---|---|
| 4,585,696 A | * | 4/1986 | Dustmann et al. ........ 174/125.1 |
| 5,102,865 A | * | 4/1992 | Woolf et al. |
| 5,254,529 A | * | 10/1993 | Divecha et al. |
| 5,356,474 A | | 10/1994 | Savkar ........................ 118/719 |
| 5,849,670 A | * | 12/1998 | Nabatame et al. ......... 174/125.1 |

FOREIGN PATENT DOCUMENTS

JP         1-93006         4/1989

* cited by examiner

*Primary Examiner*—Kamand Cuneo
(74) *Attorney, Agent, or Firm*—Foley & Lardner (57) ABSTRACT

An oxide superconducting element wire (20) comprises a base material (1), an intermediate layer (2), and an oxide superconducting thin film (3). The base material (1) being long and flexible has a cross-section in a circular or a regular polygonal form perpendicular to the longitudinal direction of the same. The periphery of the base material (1) is covered with an intermediate layer (2) and the periphery of the same is covered with an oxide superconducting thin film (3). The oxide superconducting thin film (3) has a portion in which a crystal orientation is three-axes aligned continuing in the longitudinal direction of the element wire (20).

27 Claims, 4 Drawing Sheets

OXIDE SUPERCONDUCTING CONDUCTOR WITH INTERMEDIATE LAYER HAVING ALIGNED CRYSTAL ORIENTATION

BACKGROUND OF THE INVENTION

1. Field of the Invention

The present invention relates to an oxide superconducting conductor allowing a large amount of superconducting critical current to pass therethrough incurring a small power loss, an oxide superconducting element wire for use in fabricating this conductor, and methods for fabricating the conductor and the element wire.

2. Description of the Related Art

In a metallic superconducting conductor fabrication it has been widely practiced to fabricate a superconducting conductor by bundling superconducting element wires. When bundling the element wires, it is required to increase the critical current density of the element wire and to pass currents evenly through each of the element wires in order to attain a large current flow in a superconducting state, or a current flow incurring a small loss. To decrease the AC power loss in a metallic superconducting conductor the use of a great number of fine element wires in a strand is practiced.

Further, in obtaining a superconducting element wire, efforts are being made to obtain a finer superconducting element wire having excellent flexibility and providing a greater critical current (Ic). In the case of a metallic superconducting element wire, a method to draw a bundle of coated wires is practiced.

In the oxide superconducting fabrication a similar method in practiced in metallic superconducting fabrication is also practiced in fabricating a Bi type oxide superconducting element wire, in which Bi type element wire has a Bi type superconducting core with a metallic sheath.

Recently, in fabricating a $R_xBa_yCu_zO_w$-based oxide superconducting element wire, in which the said wire has a carbon fiber or a metallic fiber as a core and superconducting film as a conductor, was attempted.

Such arts are described for example in Japanese Patent Laid-open No. Hei 1-93006, J. G. Wang et al., "Y—Ba—Cu—O superconducting fibers and wires by spray pyrolysis on carbon fibers", J. Appl. Phys. Vol. 67 No. 4, pp. 2160–2162, or L. D. Woolf et al., "Continuous fabrication of high-temperature superconductor coated metal fiber and multifilamentary wire", Appl. Phys. Lett. Vol. 58 No. 5, pp. 534–536.

Crystals of oxide superconductors generally have the orthorhombic crystal structure. The orthogonal axes of the orthorhombic lattice are called a-axis, b-axis, and c-axis in ascending order of the lengths of the axes. Of these axes, since the a-axis and b-axis have nearly the same length, they are frequently not discriminated from each other and are called the a-axis or the ab-axis. Since the superconducting current flows in the CuO plane perpendicular to the c-axis, a great superconducting current flow takes place in the direction perpendicular to the c-axis. On the other hand, the superconducting critical current density (Jc) is low in the direction parallel to the c-axis. Accordingly, in an oxide superconducting element wire aimed at obtaining a large current flow, it becomes necessary to arrange the c-axis of the crystal perpendicular to the direction of the current flow.

In a tape-formed or plate-formed substrate, a thin film whose c-axis is oriented in the perpendicular direction to the surface of a base material (such a film may hereinafter be called a c-axis oriented film) was formed by suitably selecting the forming conditions, such as depositing temperature and the like, for depositing the oxide superconducting thin film.

Another factor impeding the flow of a superconducting current, especially in the c-axis oriented film is a grain boundary caused by the crystals having different orientations in the a- and b-axes. This tendency is particularly remarkable in the case of a $R_xBa_yCu_zO_w$-type oxide superconductor. Hence in order to obtain a large Jc value, it is essential to eliminate such grain boundaries and therefore to form a thin film in which the ab-axes are aligned.

A method tried first to form an intermediate layer having a crystal alignment by an ion beam assist deposition method or an inclined substrate method (ISD method) and then to form a superconducting thin film with an crystal alignment on the intermediate layer by a pulse laser deposition method (PLD method) or a metal organic chemical vapor deposition method (MOCVD method) on a plate formed substrate for reducing the number of the grain boundary. Another method was tried which uses a thin film formed on a long and narrow single crystalline base material by such a method as a liquid phase epitaxial method, so that a crystal orientation is provided for the oxide superconducting thin film.

As to the ion beam assist deposition method, reference is made to the disclosure, for example, in Y. Iijima et al., "In-plane aligned $YBa_2Cu_3O_{7-x}$ thin films deposited on polycrystalline metallic substrates", Appl. Phys. Let. Vol. 60 No. 6, 1992, pp. 769–771, and, as to the inclined substrate method and the liquid phase epitaxial method, reference is made to the disclosure, for example, in Y. Yamada et al., "liquid Phase Epitaxy of YBCO Single-Crystalline Oxide Fibers for Power Application", Advances in Superconductivity IX Vol. 2, 1996, pp. 653–655.

(1) Of the above mentioned related art examples, that using a fiber as the core was not succeeded to align the crystal orientation of the superconducting layer and, hence, there were problems such that (a) the critical current density was restricted to a low value. And if applying the thick superconducting layer for passing enough electric current, then (b) the mechanical characteristics such as flexibility tend to deteriorate because of the superconducting layer thickness.

These problems are described in detail below.

(a) In order to form an oxide superconducting thin film with excellent superconducting characteristics it is required to align the crystal orientation of the oxide superconducting thin film. To align the said orientation, it is required either to irradiate the substrate with an ion beam directed thereto at a specific angle or to deposit a material on the substrate in a specific angular direction.

However, with a fine and round base material such as a fiber, it was thought to be impossible to make constant the irradiating angle of the ion beam or the deposited angle of the material with respect to the surface of the base material, and therefore it was thought to be impossible to obtain an oxide superconducting thin film with good crystal alignment. Hence, the critical current density was restricted to a low value. One example of the attempt was reported to provide a thin superconducting layer by a pulse laser deposition method with a carbon fiber as a core (A. Al-Sharif et al., "Attempts to prepare Bi-based superconductor on a carbon fiber substrate", J. Appl. Phys. Vol. 67 No. 9, pp. 5023–5025).

(b) As to the thickness of the superconducting layer, a superconducting current is known that flows only very near the surface of the superconductor. The pertinent thickness is considered to be around 1 μm, against which, the superconducting layer in the above described related art example was as thick as several tens of μm.

The thick superconducting layer has no contribution to the current flow amounts, and further, by the strain produced by bending at the circumferential portion of the layer, where the current flow is large, and results in deterioration of the superconducting characteristic of the wire element.

(2) As to the shape of an element wire in a tape form or plate form, the conductor design is greatly restricted and it is difficult to calculate the inductance accurately. This is described in detail below.

A tape-formed and a plate-formed element wire having a high Jc value obtained in the above-described related art, however, the direction to be bent is restricted and prevents processing in the desired conductor shape. Especially when the obtained superconducting element wires are stranded for making conductor, the manner of the stranding is greatly restricted. For example, when the wires are twisted together, the pitch in the strand must be made somewhat larger. This also causes difficulty when the superconducting conductors must be bent in actual use.

And as the tape-formed or plate-formed superconducting wire has a considerable width, the current flow pass is difficult to estimate. Therefore, when element wires are twisted together or stranded in a spiral form, it is impossible to design the inductance accurately.

SUMMARY OF THE INVENTION

Accordingly, an object of the present invention is to provide an oxide superconducting element wire, as well as an oxide superconducting conductor formed by bundling the element wires, allowing a large amount of superconducting current to flow therethrough, providing a large degree of freedom in the form of the combination of the element wires, and providing ease in the design of the inductance more accurately, and to provide a method of fabricating the same.

Another object of the present invention is to provide a method of fabrication of an oxide superconducting element wire, as well as an oxide superconducting conductor formed by bundling the element wires, capable of forming a superconducting film virtually uniform in thickness through a single film forming process with the use of a simple film forming apparatus or plural forming equipment, even if a base material of a circular cross-section is used.

The inventors found some samples which exhibited a superior superconducting critical current density (Jc), when forming an oxide superconducting thin film on an intermediate layer formed on a base material of a circular cross-section by a pulse laser deposition method.

This is considered to be due to the fact that the same angle as obtained in the inclined substrate deposition method is formed between the deposited particles and the surface of the base material at a portion of the outside surface of the circular cross section, resulting in the formation of the aligned crystal orientation at the portion of the intermediate layer on the base material, and then the aligned oxide superconducting thin film is formed on the intermediate layer. Further, it has been found that an aligned oxide superconducting thin film having in a continuous longitudinal direction of the base material can be formed by continuously forming in the longitudinal direction with moving forward the base material having the aligned intermediate layer.

The inventors analyzed the above result deeply with the pre-described references.

An intermediate layer of YSZ (Yttrium Stabilized Zirconium Oxide) or $CeO_2$ is formed on the substrate by the above described method similar to an inclined substrate method, (100) crystal planes of the intermediate layer are formed to be nearly parallel to the surface of the substrate, and the crystal orientations of the intermediate layer in the (100) plane parallel to the metallic tape tend to be aligned mostly in a specific orientation such as [010] depending on the inclination of the substrate. At a portion on the outside surface of the circular cross-section, an intermediate layer is formed in which the directions [010] are aligned in the orientation depending on the direction of the normal to the surface of the base material and the direction in which the deposited particles are caused to fly. Namely, an in-plane alignment is formed in the intermediate layer. That is, crystal orientations in the intermediate layer are close to those in a single crystal structure. (In this specification the "in-plane" alignment of the intermediate layer may hereinafter be defined as the above-described crystal orientation.) Further, when a superconducting thin film of $YBa_2Cu_3O_{7-x}$ is formed on the intermediate layer in a suitable condition, a superconducting layer aligned (001) plane can be obtained on the surface of the base material nearly parallel to the surface of the base material Namely, the c-axis is virtually perpendicular to the surface of the base material. The superconducting layer thus formed is that the a-axes or the b-axes (these two are virtually equivalent) of the superconductor are aligned in the [011] diction in the intermediate layer. The superconducting thin film forming thereof has the c-axis set perpendicular to the surface of the base material and the ab-axes aligned in the thin film, in which a large current flow takes place in the direction perpendicular to the c-axis. Namely, the crystals in the superconducting layer are three-axially aligned. (In this specification described above the aimed crystal orientation may hereinafter be defined as "three-axes alignment".) Thus, by continuously forming the intermediate layer in the longitudinal direction while moving the base material forward, the intermediate layer having the portion in which crystals are in-plane aligned as described above is formed continuously in the longitudinal direction, and that, by forming the superconducting layer on the intermediate layer, the superconducting layer having a three-axes aligned portion as described above continuously arranged in the longitudinal direction can be formed.

Therefore, the oxide superconducting element wire of the invention, in an oxide superconducting element wire obtained by forming an oxide superconducting thin film on the surface of a long and flexible base material, has a circular, elliptical, or regular polygonal cross-section orthogonal to the longitudinal direction of the base material, the oxide superconducting thin film has a portion in which a crystal orientation is three-axes aligned, and the portion having the three-axes aligned crystal orientation is continuously arranged in the longitudinal direction.

The oxide superconducting thin film on the surface of the oxide superconducting element wire of the invention is not completely three-axes aligned on the whole of the wire surface. Therefore, if seen only from the viewpoint of the value Jc of the oxide superconductor, that using a tape-formed base material in the related art can provide a higher Jc value. However, an oxide superconducting conductor obtained by bundling the element wires of the invention has a larger sectional area of the oxide superconductor than that obtained by bundling the tape-formed element wires, and hence it can pass a larger superconducting current flow.

Table 1 shows examples of trial calculations of Ic and others for the cases where a superconducting conductor 1 cm square is provided by 100 pieces in lamination of tape-formed superconducting element wires, each being of 10 mm wide×0.1 mm thick, and by bundling fine element wires of circular cross-sections.

TABLE 1

Trial Calculation for Fabrication of Superconducting Conductor

| Form of Element Wire | Element Wire Size | Superconducting Thin Film Thickness | Superconducting Thin Film Sectional Area (cm$^2$) | Assumed Jex (A/cm$^2$) | Number of Element Wires (Pieces) | IC(A) |
|---|---|---|---|---|---|---|
| Tape Form | 0.1 × 1 mm | 1 $\mu$m | $1.00 \times 10^{-4}$ | $2.0 \times 10^5$ | 100 | 2,000 |
| Circular Cross-section | 0.01 mm φ | 1 $\mu$m | $2.83 \times 10^{-7}$ | $8.0 \times 10^3$ | 1,000,000 | 2,262 |
| | 0.05 mm φ | 1 $\mu$m | $1.54 \times 10^{-6}$ | $4.0 \times 10^4$ | 40,000 | 2,463 |
| | 0.1 mm φ | 1 $\mu$m | $3.11 \times 10^{-6}$ | $6.6 \times 10^4$ | 10,000 | 5,053 |

As apparent from Table 1, when thin wires of a circular cross section are used, the value Jc of the superconducting thin film providing the same level of Ic can be made considerably smaller than when tape-formed element wires are used. While Table 1 shows the results of trial calculation in the case where superconducting element wires are simply bundled, it is necessary to strand the element wires in a spiral form or the like in the case of AC power transmitting superconducting conductors to decrease penetration of the current into the interior and increase loss of power. When such processing must be done, fine and circular element wires excellent in workability can greatly reduce the diameter of the cross-section of the superconducting conductor.

Further, since fine element wires of a circular cross-section have better workability than tape-formed element wires, they allow free designing of the form of bundling. This provides merits such that a thinner superconducting conductor can be produced for a required current value, a flat superconducting conductor can be produced depending on the conditions of the installed position, and the element wires can be stranded such that they are transposed from each other to thereby pass AC current incurring a small loss. Further, with the fine element wires of a circular cross-section, accurate calculation of the inductance can be made more easily than with the tape-formed element wires.

In order to increase the area, in which the crystal orientation is three-axes aligned, it is also effective to use a regular polygonal cross-section wire. By keeping the depositing angle of the material or the radiating direction of the ion beam with respect to each surface of the polygon constant, the crystal orientation in the intermediate layer can be in-plane aligned and, consequently, a three-axes alignment in the oxide superconducting thin film on each surface of the base material can be obtained.

In reality, when a fine base material of a regular polygonal cross-section is used, it may be difficult to keep a specific surface of the base material in a fixed angle to the deposited direction of the material through separate processing. However, if the material deposition is performed in succession to the process of forming the base material into regular polygonal cross-section, it becomes easier to keep the surface of the base material in constant angular relationship with the material deposited direction Further, if the forming portion is heated to keep at a most suitable temperature at the deposited portion, an oxide superconducting element wire providing excellent performance can be fabricated by simpler or succession processing.

In the oxide superconducting element wire as described above, the portion in which a crystal orientation is three-axes aligned is, preferably, extended continuously from around one end to around the other end of the oxide superconducting element wire.

Thereby, it becomes possible to flow a greater amount of superconducting current from around the one end to around the other end.

The method to achieve the above described oxide superconducting element wire is to provide an intermediate layer between the oxide superconducting thin film and the base material, to form in the intermediate layer a portion in which a crystal orientation is in-plane aligned and extended continuously in the longitudinal direction, and to form on the surface thereof the oxide superconducting thin film, so that the crystal orientation in the oxide superconducting thin film is extended continuously in the longitudinal direction in accordance with the crystal orientation in the intermediate layer.

Thereby, it is possible to obtain, even on the surface of an element wire of a circular cross-section, an oxide superconducting thin film having a portion in which a crystal orientation is three-axes aligned.

In the above described oxide superconducting element wire, the base material is, preferably, a metallic wire or a ceramic wire.

Thus, it becomes possible to select suitable material of the base material.

In the oxide superconducting element wire, the thickness of the oxide superconducting thin film is, preferably, sufficiently small so as to allow the transmitted electromagnetic energy to penetrate into the oxide superconducting thin film.

Thereby, the portion of the superconducting thin film not contributing to the superconducting current flow can be made smaller. Therefore, this not only improves the efficiency but the strain caused by bending at the peripheral portion where the current flows can also be decreased to improve the superconducting characteristics.

In the above described oxide superconducting element wire, the thickness of the oxide superconducting thin film is, preferably, 1.2 $\mu$m or less.

While the length of penetration of the magnetic field in a typical oxide superconductor is said to be a little larger than 1 $\mu$m, at the longest, if the film thickness is 1.2 $\mu$m or more, a favorable energy transmission efficiency for each unit volume of the conductor can be obtained. However, if there exists a deteriorated layer in the interface of the oxide superconducting thin film and the base material, the thickness of the deteriorated layer must be compensated for and, further, the thickness of the thin film must sometimes be made slightly larger to provide a good superconducting thin film. Therefore, the aforesaid thickness of the oxide superconducting thin film is not essentially limiting the present invention.

In the above-described oxide superconducting element wire, there is, preferably, further provided a metallic thin film covering the periphery of the oxide superconducting thin film.

In the above-described oxide superconducting element wire, there is, preferably, further provided an insulating thin film covering the periphery of the oxide superconducting thin film. In the above described oxide superconducting element wire, the oxide superconducting thin film, preferably, has a composition of $R_XBa_YCu_ZO_W$ ($0.1 \leq X \leq 1.5$, $1.5 \leq Y \leq 2.5$, $2.5 \leq Z \leq 3.5$, $6.5 \leq W \leq 7.5$), where R comprises one kind or more elements selected from the group of Y, Gd, Eu, Nd, Ho, Yb, Tb, Sm, Pr, Dy, Lu, Er, and Tm.

In the above-described superconducting element wire, the material of the intermediate layer is preferably selected from YSZ and $CeO_2$. The formed intermediate layer has, at a portion of the surface thereof, such an in-plane alignment, in which plane (100) is formed perpendicular to the normal to the surface of the base material and, at the portion, the directions [010] in that plane are aligned. Further, such a portion is arranged continuously in the longitudinal direction of the base material. The variation in the direction of (100) plane or in the direction [010] of (100) plane being within 10° or less have less affect on the superconducting characteristics.

In the above described oxide superconducting element wire, the maximum length of straight lines connecting any two points on the sides of the cross-section perpendicular to the longitudinal direction (including the diameter) of the element wire is, preferably, 1 mm or less.

As to the diameter of the superconducting element wires if it is too large, no current flows through the superconducting element wires in the interior because the electromagnetic field is shielded by the superconducting element wires in the circumferential portion. Also, flexibility of the superconducting element wire deteriorates when the diameter is too large. In view of these points, it is preferred that the size of the element wire for use in commercial frequency from 50 Hz to 60 Hz be 1 mm or less. As to the values of the frequency, they are simply mentioned as typical examples in use today. The aforesaid effects are essentially unchanged even if the values are changed to a certain degree.

In the above described oxide superconducting element wire, the base material is, preferably, made of a material having a larger coefficient of thermal expansion than the oxide superconducting thin film.

This is because characteristics of the oxide superconducting thin film normally suffers greater tensile strain than compressive strain. Hence, it is desired that the thin film formed in a high temperature condition and then cooled down to normal temperature should not be subjected to a tensile stress.

The oxide superconducting conductor of the invention is such that is obtained by combining a plurality of any of the above described oxide superconducting element wires. (In this specification "stranding" hereinafter may mean the processing of bundling, simply gathering or collecting, twisting and bunching a plurality of oxide superconducting element wires together for processing a plurality of superconducting element wires in the longitudinal direction to make an oxide superconducting conductor. In said stranded conductor each of the wires changes its radial position from the outer to inner and from the inner to outer sides of the oxide superconducting conductor, i.e., such that they are transposed with each other.)

It is therefore possible to obtain an oxide superconducting conductor that allows a flow of a large amount of superconducting current, provides a high degree of freedom in the design of the form of combination of the wires, and allows easy designing of the inductance.

In the above described oxide superconducting conductor, the plurality of oxide superconducting element wires are stranded, preferably, twisted together, in the longitudinal direction such that each of the oxide superconducting element wires changes its radial position from the outer to inner and from the inner to outer sides in the length direction of the oxide superconducting conductor (i.e., such that they are transposed).

Thus, by having a plurality of oxide superconducting element wires twisted together or transposed, an oxide superconducting conductor can be obtained.

A method of fabricating an oxide superconducting element wire according to an aspect of the invention comprises the following steps:

First, a long and flexible base material of a circular, elliptical, or regular polygonal cross-section orthogonal to the longitudinal direction is prepared. Then, an intermediate layer of a structure in which a portion with a crystal orientation in-plane aligned is extended continuously in the longitudinal direction is formed on the surface of the base material. Then, an oxide superconducting thin film is formed on the surface of the intermediate layer.

In the method of fabricating an oxide superconducting element wire according to an aspect of the invention, an oxide superconducting thin film is formed on an intermediate layer having a portion in which a crystal orientation is in-plane aligned as described above, which makes it possible to form an oxide superconducting thin film having a portion in which a crystal orientation is three-axes aligned. It is therefore, possible to obtain an oxide superconducting element wire constituting an oxide superconducting conductor that allows a large flow of superconducting current, providing a high degree of freedom in the design of the form of combination, and allowing easy designing of the inductance.

In the method of fabricating an oxide superconducting element wire in the aforesaid aspect, an intermediate layer is, preferably, formed in succession to a step in which the base material made of a metallic wire is heated while being formed to have a regular polygonal cross-section orthogonal to the longitudinal direction. In the formation of the intermediate layer, the material of the intermediate layer is deposited to have a predetermined angular direction with respect to a specific surface of the base material or the material of the intermediate layer is deposited while an ion beam is radiated at a predetermined angular direction to a predetermined surface of the base material so that a portion of the intermediate layer on the specific surface of the base material is provided with an in-plane alignment.

It is, therefore, possible to provide the intermediate layer with a portion in which a crystal orientation is in-plane aligned.

In the method of fabricating an oxide superconducting element wire in the above described aspect, the oxide superconducting thin film is, preferably, formed by one or more methods selected from the group of pulse laser deposition method, sputtering method, chemical vapor deposition method, liquid phase epitaxial method, and MOCVD method.

It is, therefore, possible to select a suitable method of fabricating the oxide superconducting thin film.

In the method of fabricating an oxide superconducting element wire in the above described aspect, there is, preferably, further provided the step of forming at least one of a metallic thin film and an insulating thin film for covering the periphery of the oxide superconducting thin film. The step of forming at least either of the metallic thin film and the insulating thin film is performed in succession to the step of forming the intermediate layer and the oxide superconducting thin film.

This prevents the surface of the intermediate layer from deterioration in between the processes of forming the intermediate layer and the oxide superconducting thin film. Hence, not only the productivity is improved but also the superconducting characteristics.

According to a method of fabricating on oxide superconducting conductor in an aspect of the invention, an oxide superconducting conductor is formed by combining the oxide superconducting element wires obtained in the method of fabrication with any of the above described aspects.

Thus, an oxide superconducting conductor that allows a large flow of superconducting current, provides a high degree of freedom in the form of combination, and allows easy designing of the inductance can be obtained.

In the method of fabricating an oxide superconducting conductor in the above described aspect, the step of forming the oxide superconducting conductor by combining the oxide superconducting element wires is, preferably, performed in succession to the step of fabricating the oxide superconducting thin film or the step of forming at least either of the metallic thin film and the insulating thin film.

Therefore, the oxide superconducting element wires need not be taken up on reels but can be successively stranded directly into an oxide superconducting conductor. Thus, the oxide superconducting conductors can be fabricated more efficiently. Of course, several pieces of the conductors can further be stranded to produce an oxide superconducting conductor allowing a greater critical current to pass therethrough. Further, since a plurality of element wires can be fabricated at the same time, the productivity is further improved.

In the physical deposition method such as the PLD method, the direction in which the thin film is deposited is limited by the flying direction of the material of the thin film. Therefore, when a thin film is deposited on a thin and round base material such as a fiber by a physical deposition method such as the PLD method, the superconducting layer is not formed on one half of the cross-section of the base material. Hence, in order to cover the entire surface of the base material with the superconducting layer, the thin film forming process must be performed two times or the targets must be disposed in two places. If it is further considered to mare the thickness uniform, it is necessary to repeat the film forming process additional times or to dispose targets in additional places.

Further, when there are a number of dents present on the surface of the base material, the frequency of repetitions of the film forming process or the number of disposed targets must be increased further to uniformly form the superconducting thin film also in such dents.

The same is applicable to the case of forming of an intermediate layer between the base material and the superconducting layer. The intermediate layer is especially required for preventing the superconductivity from deterioration by the diffusion of the base material into the superconducting layer. Therefore, when the intermediate layer fails to cover the entire surface of the base material, the superconducting layer may be completely deteriorated by the diffusion from the portion not recovered by in the intermediate layer and, in the worst case, possibly no superconducting current will flow.

The inventors found that an oxide superconducting thin film with uniform thickness can be formed by using a simple film forming apparatus and in only one film forming step by using a method such as to a metal organic chemical deposition (MOCVD) method as the thin film forming means to form an oxide superconducting thin film on the surface of a base material of a circular cross section or another cross sections instead of the above described pulse laser deposition method or the like, in which directivity in the deposition on the base material is high.

Uniform thickness, here, is defined as a thickness of which variation is within ±10%.

Since this method of fabrication, as a means of thin film formation, is performed with less directivity in the deposition on the base material than that of the above described pulse laser deposition method or the like, a thin film can be formed uniform thickness on the entire periphery of the base material.

In the formation of the intermediate layer, however, it is difficult to control the crystal orientation by this method. One effective solution is to use the method to irradiate ion beams at a specific angle during the film formation. The film formation and ion beam irradiation is carried out by alternately repeating the film formation and the ion beam irradiation in forming an intermediate layers having a portion of an in-plane alignment. Then, by forming thereon an oxide superconducting layer by the MOCVD method, a portion in which three-axes alignment is established could be obtained in the superconducting layer.

Although the Jc value of the oxide superconductor itself is also lower than that of the tape-formed base material, it can pass a larder amount of superconducting current therethrough than that of the tape-formed base material as shown in Table 1, when superconducting element wires obtained by this method are stranded into a superconducting is conductor.

As to the material and structure of the oxide superconducting element wire produced by this method and the method of fabricating the oxide superconducting conductor by combining the element wires, it should be noted here that the same material, structure, and fabricating method as described above are used.

It should further be noted here that the continuous performance of the steps to form the required layers (intermediate layer, superconducting thin film, and protecting layer) is advantageous from the viewpoint of not only the productivity but also product performances. For example, the problems of surface deterioration produced during the time between the formation of the intermediate layer and the superconducting thin film or between the formation of the superconducting thin film and the protecting layer, in the lower layer can be obviated by forming these layers in succession.

Further, since the diameter of the element wire of the circular-cross section can be made smaller than that of the tape-formed element wire, a plurality of element wires can be simultaneously processed with a film forming apparatus. Therefore, in producing superconducting element wires described herein, it is more efficient to fabricate a plurality of element wires at the same time.

Further, the simultaneous fabrication of all the required element wires for making a superconducting conductor makes it possible to continuously strand the element wires without taking up the element wires and, thereby, the superconducting conductor can be fabricated more efficiently. Of course, it is possible to further strand a plurality of the thus stranded wires to thereby obtain a superconducting conductor allowing a larger flow of critical current.

Further, the intermediate layer and the protecting layer of uniform thickness can be formed by the use of a simple film forming apparatus in a single film-forming step, and thereby the superconducting thin film is prevented from deteriorating in its entirety by diffusion.

DESCRIPTION OF THE PREFERRED EMBODIMENTS

Embodiments of the invention will be described with reference to the accompanying drawings.

Figure 1:
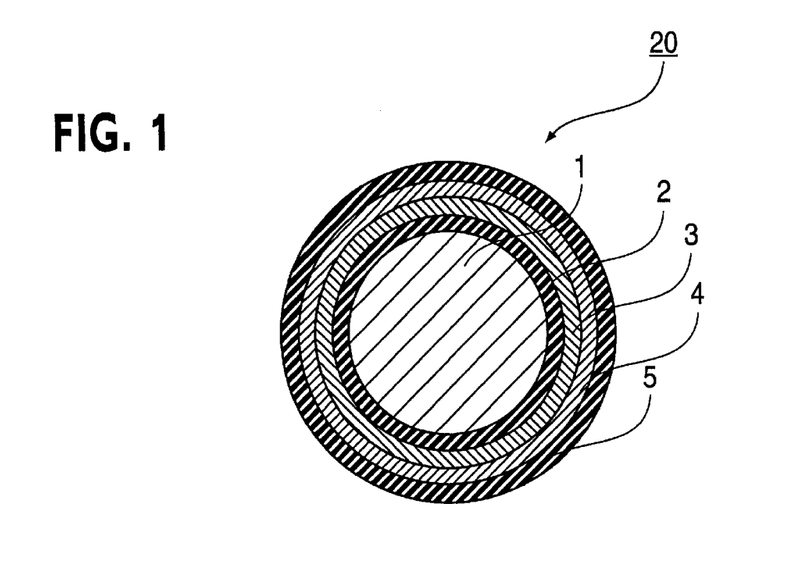
FIG. 1 is a schematic cross-sectional view showing the structure of an oxide superconducting element wire according to an embodiment of the invention.

FIG. 1 is a sectional drawing schematically showing a structure of an oxide superconducting element wire according to an embodiment of the invention. FIG. 1 shows a cross section perpendicular to the longitudinal direction of the oxide superconducting element wire.

Referring to FIG. 1, a base material 1 made of a stainless steel wire of for example 50 $\mu$m in diameter is provided, on the peripheral surface thereof, with an intermediate layer 2 made of a YSZ layer having a partially in-plane aligned crystal orientation formed for example by a PLD method. Further, on the periphery thereof, an oxide superconducting layer 3 made of a $YBa_2Cu_3O_{7-x}$ layer is formed.

Figure 2:
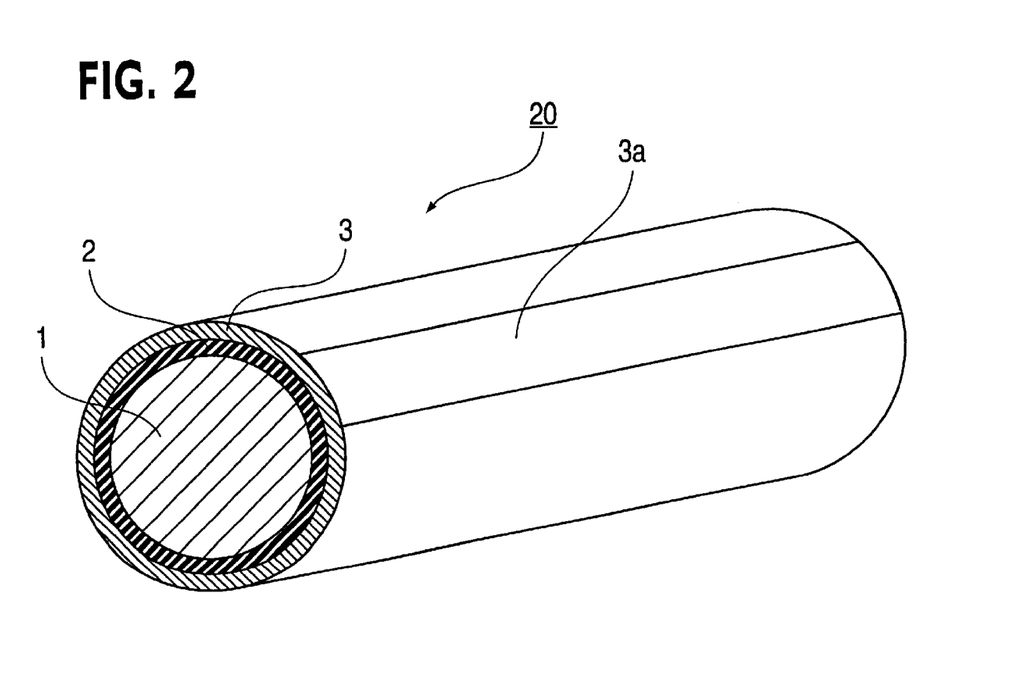
FIG. 2 is a partial perspective view showing the structure of an oxide superconducting element wire according to an embodiment of the invention.

The oxide superconducting layer 3 has also a portion 3a in which a crystal orientation is three-axes aligned continuously in the longitudinal direction as shown in FIG. 2. The portion 3a with the three-axes aligned crystal orientation is extended continuously from around one end to around the other end of the element wire. Referring to FIG. 1, on the periphery of the oxide superconducting layer 3, a protective layer 4 made of a silver layer is formed for example by a sputtering method, and, further, on the periphery of the protecting layer 4, an insulating layer 5 made of a YSZ layer is formed for example by a sputtering method. Incidentally, FIG. 2 shows only a portion of an element wire which is further extended in the longitudinal direction.

Figure 3:
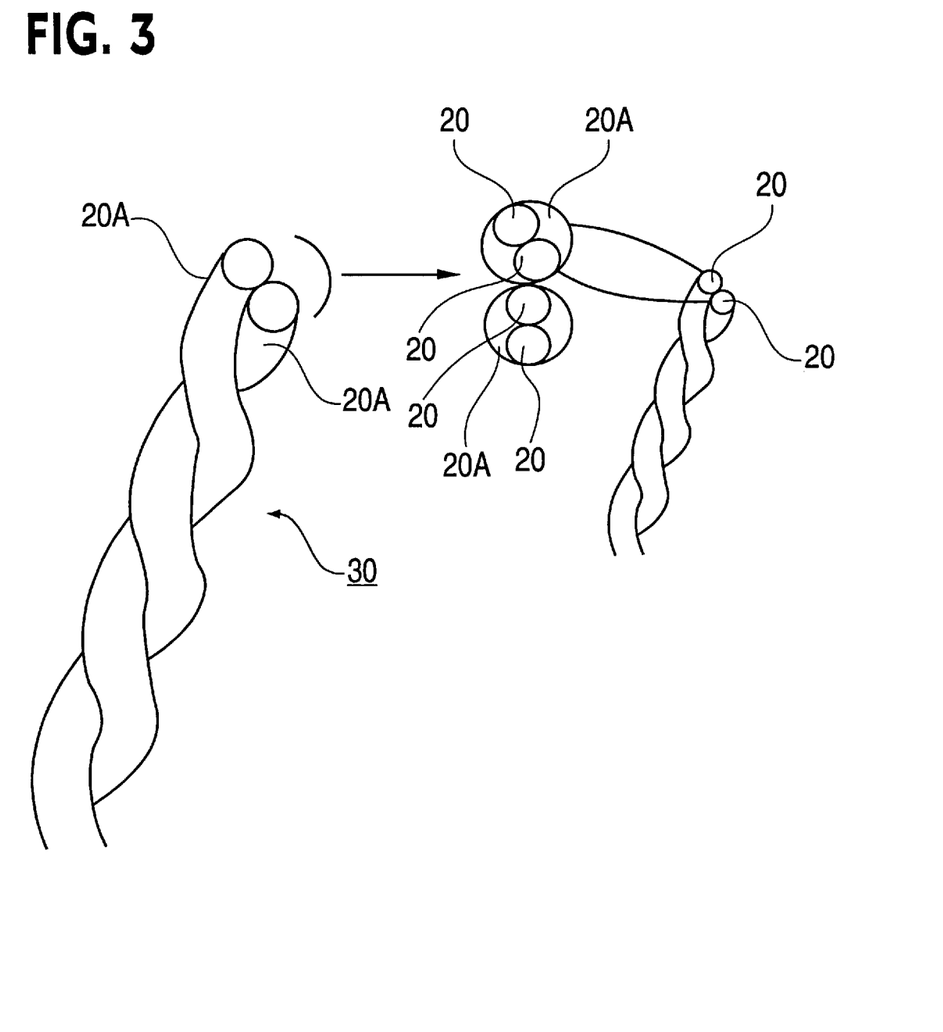
FIG. 3 is a schematic cross-sectional view showing the structure of an oxide superconducting conductor according to an embodiment of the invention.

FIG. 3 is a sectional schematic view showing the structure of an oxide superconducting conductor in an embodiment of the invention. Referring to FIG. 3, the oxide superconducting conductor 30 is constructed by having a plurality of oxide superconducting element wires as shown in FIG. 1 and FIG. 2 stranded together. A favorable result will be obtained by not only simply bundling a plurality of element wires but by arranging the element wires to change their radial positions from the inner to outer and from the outer to inner sides of the oxide superconducting conductor (namely, by transposing them with each other) while they are stranded in the longitudinal direction.

In more concrete terms, two element wires 20 are twisted with each other to form the wire 20A and further the two pieces of the twisted wires 20A are twisted together to form the oxide superconducting conductor 30. By the described arrangement, all of the element wires are allowed to run evenly on the inner side and the outer side of the conductor 30. Of course, the element wires twisted together need not be two in number and more than two at a time may be twisted together. Likewise the number of wires 20A twisted together to form conductor 30 may be two or more.

As the base material 1, other than a stainless steel wire, metallic wires of nickel, hastelloy, silver, and the like or ceramic fibers such as SiC fiber may be used. As to the thickness of the oxide superconducting thin film 3, it is preferred that the thickness be sufficiently small so as to allow the transmitted electromagnetic energy to penetrate into the thin film 3 (for example, 1.2 $\mu$m or below).

The oxide superconducting thin film 3 is not limited to the composition of $YBa_2Cu_3O_{7-x}$ but may preferably have the composition of $R_XBa_YCu_ZO_W$ ($0.1 \leq X \leq 1.5$, $1.5 \leq Y \leq 2.5$, $2.5 \leq Z \leq 3.5$, $6.5 \leq W \leq 7.5$), where R comprises one or more kinds of elements selected from the group of Y, Gd, Eu, Nd, Ho, Yb, Tb, Sm, Pr, Dy, Lu, Er, and Tm.

It is preferred that the diameter of the oxide superconducting element wire 20 be 1 mm or less Further, it is preferred that the base material 1 be made of a material having a greater coefficient of thermal expansion than the oxide superconducting thin film 3.

Further, it is preferred that the diameter of the element wire be sufficiently small so as to substantially restrain the transmitted direction of the electromagnetic energy from becoming non-uniform in the range of frequency of the transmitted electromagnetic energy. Further, it is preferred that the diameter of the element wire 20 be sufficiently small 80 as not to substantially impair the bending of the conductor.

A method of fabricating a superconducting conductor in an embodiment of the invention will be described below.

Figure 4:
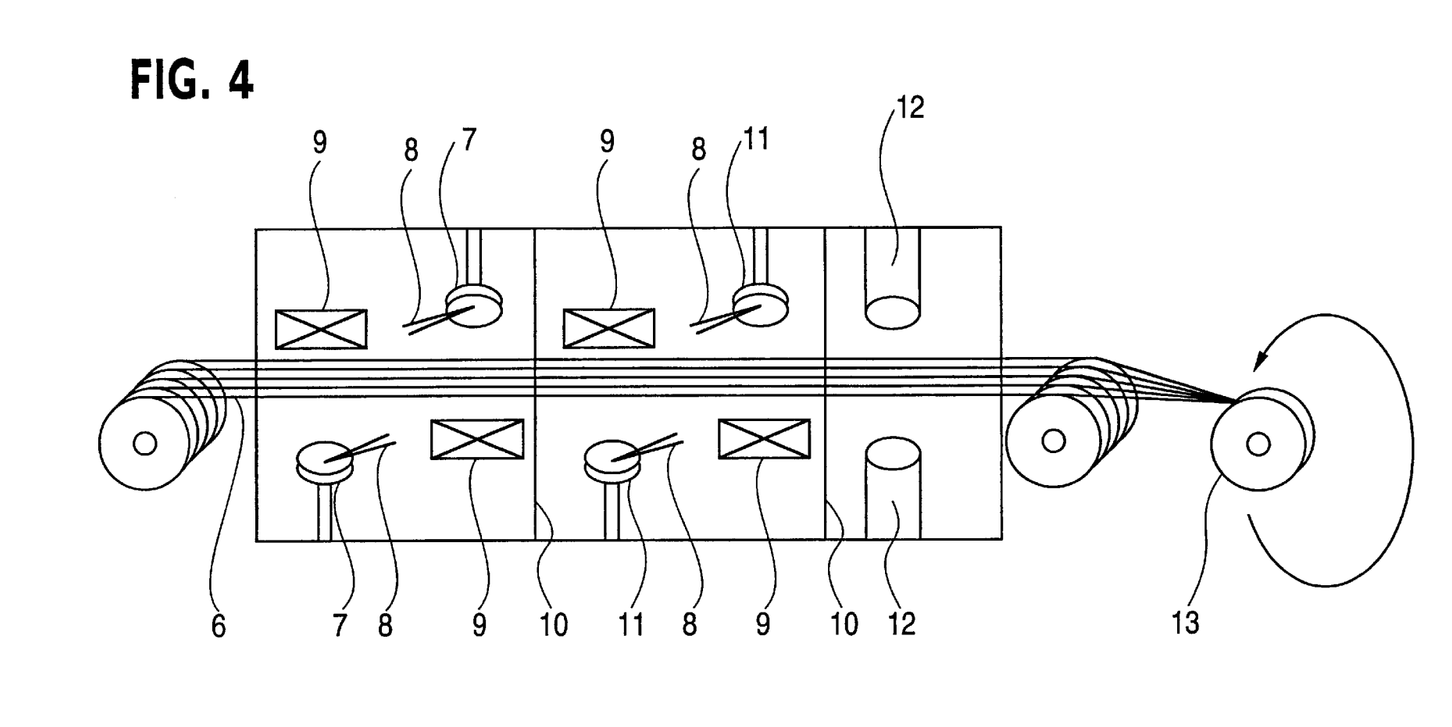
FIG. 4 is a drawing showing an example of the first method of fabricating an oxide superconducting conductor according to an embodiment of the invention.

FIG. 4 is a drawing showing an example of the first method of fabricating a superconducting conductor in an embodiment of the invention. Referring to FIG. 4, a plurality of wires 6 as the base material (for example, metallic wires of stainless steel, nickel, hastelloy, silver, and the like, or ceramic fibers such as SiC fibers) are fed in at the same time. The wires 6 are introduced into a thin film forming vessel and an intermediate layer, an oxide superconducting layer, and a protective layer are formed in the order named. The intermediate layer is deposited on the wires 6, which are heated by heaters 9, by irradiating intermediate-layer targets 7 with laser beams 8 so that the substance of the targets is sputtered. The oxide superconducting thin film 3 is deposited on the wires 6, heated by heaters 9, by irradiating oxide superconductor-targets 11 with laser beams 8 causing the substance of the targets to sputter. The protective layer is deposited on the wires 6 by causing the substance of material targets 12 to sputter.

Each of the forming chambers in the thin film-forming vessel is separated by partition walls 10. The partition walls 10 are provided with fine holes allowing the wires G to pass therethrough. In order to have the intermediate layer, the oxide superconducting layer, and the protective layer to be formed on the entire surfaces of the wires 6, the targets 7 and 12 are disposed on both the upper and lower sides of the wires 6.

The intermediate layer and the oxide superconducting thin film are formed by a PLD method, and the protective layer is formed by a RF sputtering method. The wires 6 with these layers formed thereon are led out of the thin film forming vessel through the fine holes and then stranded the element wire at stranding and taking up portion 13 to provide an oxide superconducting conductor.

FIG. 4 illustrates a case where a plurality of element wires are collectively taken up. The element wires are twisted together by the take-up reel, rotating with the collected portion of the element wire taken as the axis of rotation, in the combining portion 13 to provide an oxide superconducting conductor. When a more intricate mechanism is used, it is also possible to twist a plurality of oxide superconducting element wires together or to strand the plurality of superconducting element wires to be positioned them such that each of the element wires changes its radial position from the outer to inner and from the inner to outer sides of the oxide superconducting conductor (i.e., such that they are transposed with each other).

A case where a plurality of element wires 6 are fabricated at the same time and stranded in succession are described in the foregoing. However, a single wire 6 may be fabricated at high speeds to be stored up and pieces of the wire may later be stranded into a conductor, or it may sometimes be effective to fabricate a plurality of wires 6 at the same time individually and later to strand a suitable number of pieces of the wires in a suitable form and in a suitable manner of fabrication according to the design to obtain a required conductor. Plural sets of element wires 6 once may later be collected and stranded into a conductor allowing a larger critical current flow. Such methods may be properly used in conformity with the design of conductors and manners of production.

While cases where oxide superconducting thin films 3 are formed by the PLD method have been described above, they may otherwise be formed by a sputtering method, a chemical vapor deposition method, a liquid phase epitaxial method, or an MOCVD method or by a combination of such methods.

The intermediate layer 2 formed the in-plane aligned crystal orientation at the portion of the surface of the base material by using any of the above described methods are aligned continuously in the longitudinal direction.

Figure 5:
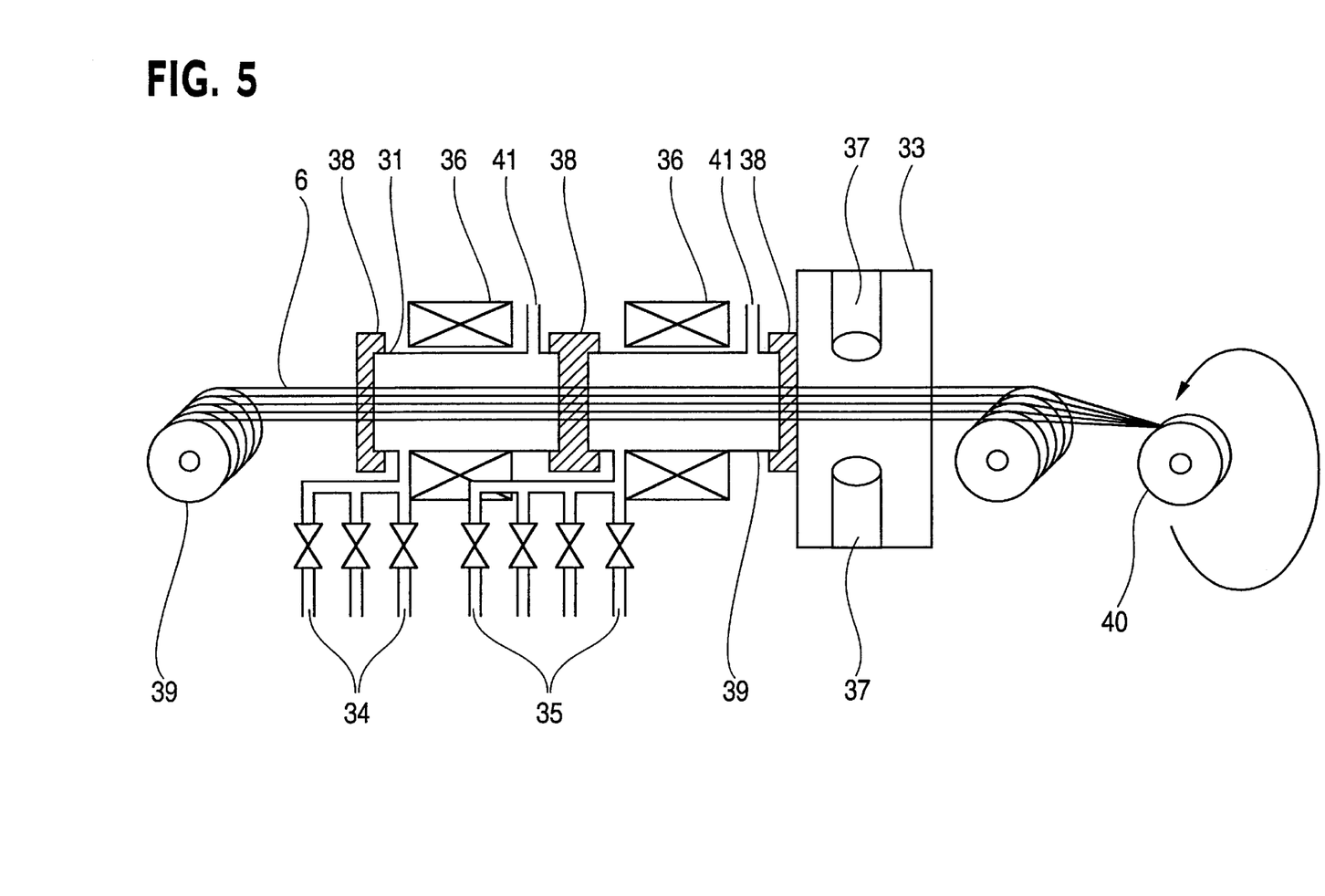
FIG. 5 is a drawing showing an example of the second method of fabricating an oxide superconducting conductor according to an embodiment of the invention.

FIG. 5 is a drawing showing an example of the second method of fabricating a superconducting conductor according to an embodiment of the invention. Referring to FIG. 5, an intermediate layer forming chamber 31, a superconducting thin film forming chamber 32, and a protective layer forming chamber 33 are connected together through flanges 38, Around the intermediate layer forming chamber 31 and the superconducting thin film forming chamber 32, there are disposed heaters 36. The intermediate layer forming chamber 31 and the superconducting thin film forming chamber 32 are each provided with an inlet portion of intermediate layer material gas 34, an inlet portion of superconducting thin film material gas 35, and gas exhaustion outlets 41. Within the protective layer-forming chamber 33, there are disposed targets 37 as the material of the protective layer.

The flanges 38 have fine holes made therein for allowing the base materials 6 to pass therethrough and these fine holes are designed not to allow the atmospheres in the adjoining film forming chambers and atmospheres between the film forming chambers 31, 32 and 33, and the outside to mix together.

The base material 6 fed in from the supply portion 39 is moved in the film forming apparatus by being taken up by a combining and taking-up portion 40. The base material 6 in first introduced into the intermediate layer-forming chamber 31 and therein an intermediate layer is formed on the surface of the base material 6 for example by the MOCVD method. At this time, the chamber is externally heated by the heaters 36 and the material gas is supplied from the inlet portion of the intermediate layer material gas 34.

Then, in the superconducting film-forming chamber 32, an oxide superconducting thin film is formed on the intermediate layer for example by the MOCVD method. At this time, the chamber is externally heated by the heaters 36 and the material gas is introduced from the superconducting film material gas inlet portion 35.

Then, in the protective film-forming chamber 33, the protective layer is formed on the surface of the superconducting thin film for example by a DC sputtering method. At this time, the target material is sputtered from the protecting layer material target 37 so that the protecting layer is deposited.

Superconducting element wires are fabricated as described above and they are stranded and taken up in the stranding and taking-up portion 40.

FIG. 5 illustrates a case where a plurality of element wires are collectively taken up and the element wires are twisted together by the take-up reel, rotating with the collected portion of the element wire taken as the axis of rotation, in the combining and taking-up portion 40 to provide an oxide superconducting conductor. When a more intricate mechanism is used, it is also possible to twist a plurality of oxide superconducting element wires with each other or to strand the plurality of superconducting element wires to be positioned them such that each of the element wires changes its radial position from the outer to inner and from the inner to outer sides of the oxide superconducting conductor (i.e., such that they are transposed together).

While a case where the protective layer is formed by the DC sputtering method has been described above, it may be formed by the MOCVD method or another method. Further, though a case where the intermediate layer is formed by the MOCVD method has been described above, it may otherwise be formed by a method such as the sputtering method. While a case where the oxide superconducting thin film is formed for example by the MOCVD method has been described above, it may be formed by any another method which like the MOCVD method makes it possible to form an oxide superconducting thin film of uniform thickness around the circumference of the base material through a single thin film forming step.

EXAMPLES

Examples of the present embodiment will be described below.

Example 1

First, in the apparatus configured as shown in FIG. 1, an oxide superconducting element wire has been fabricated using a stainless steel wire as the base material 1, a YSZ layer as the intermediate layer 2, a $YBa_2Cu_3O_{7-x}$ layer as the oxide superconducting thin film 3, a silver layer as the protective layer 4, and a YSZ layer as the insulating layer 5. Methods of fabricating layers, forming temperatures, forming atmospheres, and the film thickness of fabricated oxide superconducting element wires are shown in Table 2.

TABLE 2

| Thin Film Layer | Forming Method | Temperature | Atmosphere | Thickness ($\mu$m) |
|---|---|---|---|---|
| YSZ | PLD | 500° C. | 50 m Torr (Ar) | 0.8 |
| YBCO | PLD | 770° C. | 100 m Torr ($O_2$) | 0.8 |

TABLE 2-continued

| Thin Film Layer | Forming Method | Temperature | Atmosphere | Thickness ($\mu$m) |
|---|---|---|---|---|
| Silver | DC Sputtering | Room Temperature | 0.1 m Torr | 2.0 |
| YSZ | RF Sputtering | Room Temperature | 50 m Torr (Ar) | 0.8 |

The formation of the layers 2–5 is continuously performed in two directions toward the base material 1 so that the layers 2–5 are formed on the entire surface of the base material 1. The thickness of the layers 2–5 have been estimated from the thickness of respective layers 2–5 simultaneously formed on a stainless steel plate.

Twenty pieces of the element wires fabricated as described above have been stranded to fabricate an oxide superconducting conductor The average value of Ic of the element wires at 77 K was 5.6 mA and the value of Ic of the conductor obtained by combining the same was 108 mA. This value proves to be higher than the value of Ic of an oxide superconducting conductor fabricated by combining element wires in a tape form. The critical current density of the YBCO layer (oxide superconducting thin film) is estimated at around $4 \times 10^3$ A/cm$^2$. This value is that of a product experimentally produced by a laboratory scale apparatus. If they are produced by a dedicated apparatus under suitably controlled conditions, characteristics of the product and the number of superconducting element wires to be stranded will be increased.

Example 2

Referring to FIG. 1, a stainless steel wire of 50 $\mu$m in diameter was used as the base material 1 and sa YSZ intermediate layer 2 was first formed on its surface by an MOCVD method. Then, a YBa$_2$Cu$_2$O$_{7-x}$ layer 3 was formed as the oxide superconducting thin film by the MOCVD method. On the surface thereof, a silver layer 4 was formed as the protective layer by a DC sputtering method. In that case, the thin film was formed by alternately repeating the deposition of an oxide superconductor by the MOCVD method and the irradiation of Ar$^+$ ion beams from one direction Then, a Y$_x$Ba$_y$Cu$_z$O$_W$ layer 3 as the oxide superconductor was formed by the MOCVD method. On the surface thereof, a silver layer 4 as the protective layer was formed by a DC sputtering method.

Twenty pieces of the element wires fabricated as described above were stranded to provide an oxide superconducting conductor. The average value of Ic of the element wires at 77 K was 4 mA and the value of Ic of the conductor obtained by bundling the same was 77 mA. This value is that of a product experimentally produced by a laboratory scale apparatus. If they are produced by a dedicated apparatus under suitably controlled conditions, characteristics of the product and the number of superconducting element wires to be stranded will be increased.

The embodiments and examples disclosed herein, in all of their aspects, are solely illustrative and not limitative of the invention. The scope of the invention is determined not by the foregoing description but by the accompanying claims and various changes and modifications that fall within the equivalent spirit and scope of the claims that are intended to be embraced by the claims.

According to the present invention, as described in the foregoing, since a superconducting conductor is fabricated by combining superconducting element wires superior in workability, the degree of freedom in the design of the superconducting conductor. namely, the manner of combining the element wires, can be enhanced. It is, therefore, possible to obtain superconducting conductors suitable for each of the applications and to allow a large amount of superconducting current to flow therethrough.

What is claimed is:

1. An oxide superconducting element wire having an oxide superconducting thin film formed on the surface of a long and flexible base material, comprising:
    the sectional shape of said base material being a circle, an ellipse, or a regular polygon orthogonal to the longitudinal direction of said base material;
    an intermediate layer placed between said oxide superconducting thin film and said base material;
    said intermediate layer having a portion in which a crystal orientation is in-plane aligned and said portion aligned continuously in said longitudinal direction; and
    said oxide superconducting thin film having a portion in which a crystal orientation is three-axes aligned and said portion aligned continuously in said longitudinal direction.

2. An oxide superconducting element wire according to claim 1, wherein said portion of said superconducting thin film having the three-axes aligned crystal orientation is aligned continuously from the proximity of one end to the proximity of the other end.

3. An oxide superconducting element wire according to claim 1, wherein said base material is a metallic wire or a ceramic fiber.

4. An oxide superconducting element wire according to claim 1, wherein the thickness of said oxide superconducting thin film is sufficiently small so as to allow the electromagnetic energy transmitted thereby to penetrate into said oxide superconducting thin film.

5. An oxide superconducting element wire according to claims 4, wherein the thickness of said oxide superconducting thin film is 1.2 $\mu$m or less.

6. An oxide superconducting element wire according to claim 1, further having a metallic thin film covering the periphery of said oxide superconducting thin film.

7. An oxide superconducting element wire according to claim 1, further having an insulating thin film covering the periphery of said oxide superconducting thin film.

8. An oxide superconducting element wire according to claim 1, wherein said oxide superconducting thin film has a composition of R$_X$Ba$_Y$Cu$_Z$O$_W$ ($0.1 \leq X \leq 1.5$, $1.5 \leq Y \leq 2.5$, $2.5 \leq Z \leq 3.5$, $6.5 \leq W \leq 7.5$), where R comprises one kind or more elements selected from the group of Y, Gd, Eu, Nd, Ho, Yb, Tb, Sm, Pr, Dy, Lu, Er, and Tm.

9. An oxide superconducting element wire according to claim 8, wherein said intermediate layer is made of either YSZ or CeO$_2$.

10. An oxide superconducting element wire according to claim 1, wherein the diameter of the circumscribed circle of the cross-section orthogonal to said longitudinal direction being 1 mm or less.

11. An oxide superconducting element wire according to claim 1, wherein said base material is made of a material having a greater coefficient of thermal expansion than the coefficient of thermal expansion of said oxide superconducting thin film.

12. An oxide superconducting conductor formed by combining a plurality of oxide superconducting element wires according to claim 1.

13. An oxide superconducting conductor according to claim 12, wherein said plurality of oxide superconducting element wires are stranded such that they are changed from the inner to outer and the outer to inner sides of said oxide superconducting conductor.

14. A method of fabricating an oxide superconducting element wire comprising:
preparing a long and flexible base material having a circular, an elliptical, or a regular polygonal cross-section orthogonal to the longitudinal direction;
forming on the surface of said base material an intermediate layer of a structure having a portion in which an in-plane aligned crystal orientation is aligned continuously in said longitudinal direction; and
forming an oxide superconducting thin film on the surface of said intermediate layer, wherein said oxide superconducting thin film has a portion in which crystal orientation is three-axes aligned and said portion is aligned continuously in said longitudinal direction.

15. A method of fabricating an oxide superconducting element wire according to claim 14 wherein,
said intermediate layer is aligned by depositing the material of said intermediate layer in a single or plurality of angular directions, or by depositing said material while ion beams are irradiated on said base material in a single or plurality of angular directions.

16. A method of fabricating an oxide superconducting element wire according to claim 15 wherein
said intermediate layer is formed in succession to a step in which said base material made of a metallic wire is formed to have a regular polygonal cross section orthogonal to said longitudinal direction in a heated condition, and
at the time of forming said intermediate layer, the material of said intermediate layer is deposited on said base material in a predetermined angular direction with respect to a specific plane of said base material or is deposited on said base material while ion beams are irradiated on said base material in a predetermined angular direction, and thereby an in-plane alignment is produced at a portion of said intermediate layer along said specific plane of said base material.

17. A method of fabricating an oxide superconducting element wire according to claim 15, wherein said oxide superconducting thin film is formed by one or more methods selected from the group of pulse laser deposition method, sputtering method, chemical vapor deposition method, liquid phase epitaxial method, and metal organic chemical vapor deposition method.

18. A method of fabricating an oxide superconducting element wire according to claim 15, further comprising the step of forming at least either a metallic thin film or an insulating thin film for covering the periphery of said oxide superconducting thin film, wherein
the step of forming at least either of said metallic thin film and said insulating thin film is performed in succession to the step of forming said intermediate layer and said oxide superconducting thin film.

19. A method of fabricating an oxide superconducting conductor by combining said oxide superconducting element wires obtained by said method of fabricating the same according to claim 15.

20. A method of fabricating an oxide superconducting conductor according to claim 19, wherein the step of forming said oxide superconducting conductor by combining said oxide superconducting element wires is fabricated in succession to the step of fabricating said oxide superconducting thin film and the step of forming at least either of said metallic thin film or said insulating thin film.

21. A method of fabricating an oxide superconducting element wire according to claim 14, wherein
said intermediate layer is formed by a metal organic chemical deposition method with irradiating ion beams in a single or plurality of directions on said base material simultaneously, or is formed by alternately depositing the intermediate layer with a metal organic chemical deposition method and irradiating ion beams in a single or plurality of angular directions on said base material.

22. A method of fabricating an oxide superconducting element wire according to claim 21, wherein said oxide superconducting thin film is formed by a metal organic chemical deposition method.

23. A method of fabricating an oxide superconducting element wire according to claim 21, wherein said oxide superconducting thin film has a composition of $R_XBa_YCu_ZO_W$ ($0.1 \leq X \leq 1.5, 1.5 \leq Y \leq 2.5, 2.5 \leq Z \leq 3.5, 6.5 \leq W \leq 7.5$), where R comprises one kind or more elements selected from the group of Y, Gd, Eu, Nd, Ho, Yb, Tb, Sm, Pr, Dy, Lu, Er, and Tm.

24. A method of fabricating an oxide superconducting element wire according to claim 22, wherein the portion of said oxide superconducting thin film having the three-axes aligned crystal orientation is aligned continuously in the longitudinal direction of said base material.

25. A method of fabricating an oxide superconducting element wire according to claim 21, wherein said oxide superconducting thin film is formed such that the variation in thickness thereof is within ±10%.

26. A method of fabricating an oxide superconducting conductor by combining said oxide superconducting element wires obtained by said method of fabricating the same according to claim 21.

27. An oxide superconducting element wire having an oxide superconducting thin film formed on the surface of a long and flexible base material comprising:
said base material being a metallic wire or a ceramic fiber;
the sectional shape of said base material being a circle, an ellipse, or a regular polygon orthogonal to the longitudinal direction of said base material;
an intermediate layer being placed between said oxide superconducting thin film and said base material;
said intermediate layer being made of either YSZ or $CeO_2$;
said intermediate layer having a portion of an in-plane aligned crystal orientation and said portion is aligned continuously in said longitudinal direction;
said oxide superconducting thin film having a composition of $R_XBa_YCu_ZO_W$ ($0.1 \leq X \leq 1.5, 1.5 \leq Y \leq 2.5, 2.5 \leq Z \leq 3.5, 6.5 \leq W \leq 7.5$), where R comprises one or more kinds of elements selected from the group of Y, Gd, Eu, Nd, Ho, Yb, Tb, Sm, Pr, Dy, Lu, Er, and Tm;
the thickness of said oxide superconducting thin film being 1.2 µm or less;
said oxide superconducting thin film having a portion, in which a crystal orientation is three-axes aligned and said portion is aligned continuously in said longitudinal direction; and
the diameter of the circumscribed circle of the cross section orthogonal to said longitudinal direction being 1 mm or less.

* * * * *